United States Patent [19]
Printz et al.

[11] Patent Number: 5,592,162
[45] Date of Patent: Jan. 7, 1997

[54] INTERVAL WIDTH UPDATE PROCESS IN THE ARITHMETIC CODING METHOD

[75] Inventors: Harry W. Printz, New York, N.Y.; Peter R. Stubley, Outremont, Canada

[73] Assignee: Digital Equipment International, Ltd., Fribourg, Switzerland

[21] Appl. No.: 216,741

[22] Filed: Mar. 23, 1994

[30] Foreign Application Priority Data

Mar. 29, 1993 [FR] France ................ 93 03590

[51] Int. Cl.$^6$ .................................. H03M 7/00
[52] U.S. Cl. ......................... 341/107; 341/106
[58] Field of Search ................ 341/51, 65, 106, 341/107

[56] References Cited

U.S. PATENT DOCUMENTS

| | | | |
|---|---|---|---|
| 4,467,317 | 8/1984 | Langdon, Jr. et al. | 341/107 |
| 4,989,000 | 1/1991 | Chevion et al. | 341/107 |
| 5,298,896 | 3/1994 | Lei et al. | 341/51 |
| 5,307,062 | 4/1994 | Ono et al. | 341/107 |
| 5,404,140 | 4/1995 | Ono et al. | 341/107 |

OTHER PUBLICATIONS

Storer "Image and Text Compression" 1990, Kluwer Academic Press, Boston U.S., pp. 96–102.

*Primary Examiner*—Marc S. Hoff
*Attorney, Agent, or Firm*—Denis G. Maloney; Arthur W. Fisher; Joanne Pappas

[57] ABSTRACT

The present invention relates to an interval width update process in arithmetic coding, characterized in that a set of values $\mathcal{A}=\{A[0],A[1],\ldots,A[r-1]\}$, is selected and the interval width is maintained as an index $W_i$ in said set, a single table lookup simultaneously updates the interval width and supplies the augend and shift by performing the following operation:

$$(W_{i+1}, X_i, R_i) = f'''(S_i, W_i)$$

in which the function $f'''$ is implemented by a single table lookup, in which $p(S_i)$ and $P(S_i)$ are determined from $S_i$, $A[W_i]$ is determined from $W_i$, $p(S_i) \cdot A[W_i]$ and $R_i = P(S_i) \cdot A[W_i]$ are computed, the shift $X_i$ necessary for representing $p(S_i) \cdot A[W_i] \cdot 2^{X_i}$ in $\mathcal{R}$ is determined. $W_{i+1}$ is determined in such a way that $A[W_{i+1}]$ is the best representative of $p(S_i) \cdot A[W_i] \cdot 2^{X_i}$, followed by return to $W_{i+1}$, $X_i$ and $R_i$.

3 Claims, 1 Drawing Sheet

INTERVAL WIDTH UPDATE PROCESS IN THE ARITHMETIC CODING METHOD

TECHNICAL FIELD

The present invention relates to an interval width update process in the arithmetic coding method.

PRIOR ART

General Explanation Of Arithmetic Coding

As described in the article by Glen G. Langdon, Junior entitled "An Introduction to Arithmetic Coding" (IBM Journal of Research and Development, 28(2), pp. 135–149, March 1984), arithmetic coding is a well known lossless data compression method.

Arithmetic coding establishes a correspondence between a sequence of symbols and an interval of real numbers. The starting point is the interval [0,1]. When each symbol is coded, the current interval is replaced by a subinterval thereof. After coding a sequence of symbols, the original sequence can be exactly reconstructed, no matter what the given point in the current interval.

In this type of coding it is conventional practice to store the leftmost point of the interval as the result, the value obtained being called the code point.

This coding algorithm is recursive. For each symbol to be coded, the algorithm divides the current interval as a function of occurrence probabilities and the order given by the list of symbols which can be coded. The algorithm then replaces the current interval by the subinterval corresponding to the symbol to be coded. This procedure is repeated for the number of times which is necessary for coding a given sequence.

Mathematical Explanation Of Arithmetic Coding

Up to now a geometrical explanation has been given of arithmetic coding. Reference is made to intervals and their subdivision. For implementation in a computer, it is necessary to explain the method using numerical quantities and this explanation will now be given.

In the following description the following notations are adopted:

| | |
|---|---|
| $S = \{s^0, s^1, \ldots, s^{N-1}\}$ | set of codable N symbols |
| $S_i$ | symbol to be coded in stage i |
| $p(S_i)$ | symbol occurrence probability |
| $P(S_i)$ | cumulative symbol probability |
| $A_i$ | current interval width |
| $\mathcal{R}$ | range of admissible values of $A_i$ |
| $X_i$ | shift for representing $p(S_i) \cdot A_i 2^{X_i}$ |
| $X_{max}$ | maximum possible value of $X_i$ |
| $R_i$ | augend of $P(S_i) \cdot A_i$ |
| $C_i$ | value of current code point (location of leftmost point of interval) |
| $\zeta_i$ | as $C_i + R_i$ unshifted |
| $B_i$ | $1 + X_i$ output bits |
| $T_k$ | fixed width bit block. |

As previously explained, in each stage the coder state is given by a subinterval of [0,1]. The process for coding a symbol consists of replacing the current interval by a subinterval of itself.

For representing the current interval in a computer, two arithmetic quantities are updated, mainly $C_i$, the left-most point of the interval, and $A_i$ the interval width. Thus, for each stage the actual interval is $[C_i, C_i+A_i]$.

Thus, the process given hereinbefore for coding a symbol is expressed by the following equations:

$$A_{i+1} = p(S_i) \cdot A_i \quad (1)$$

$$C_{i+1} = C_i + P(S_i) \cdot A_i \quad (2)$$

in which $p(S_i)$ is the modelized probability of the symbol $S_i$ and $P(S_i)$ is the sum of the probabilities of all the symbols preceding $S_i$ in the list of the source alphabet $$P(s^k) = \sum_{j<k} P(S^j)$$

These equations arithmetically represent the same subdivision and selection procedure described above. The first relates to the recurrence of the interval width and the second to the recurrence of the code point.

Explanation Of The Finite Precision Algorithm For Arithmetic Coding

These equations assume an infinite precision arithmetic. For carrying out arithmetic coding on finite precision arithmetic operations, use is made of the approach of Frank Rubin in an article entitled "Arithmetic Stream Coding Using Fixed Precision Registers" (IEEE Transactions on Information Theory, IT-25(6), pp. 672–675, November 1979). The number of bits used for representing each of the $S_i$, $R_i$, $A_i$, $C_i$, $B_i$, $p(S_i)$ and $P(S_i)$ is fixed, said quantities being designated by #s, #R, #A, #C, #B, #p and #P. It should be noted that #P=#p. The range $\mathcal{R}=[\alpha, 2\alpha]$, in which $\alpha>0$ of the admissible interval widths is also chosen It is ensured that $A_i \Sigma \mathcal{R}$ always applies and for this purpose the following operations are performed in each stage of coding:

1. Obtain $p(S_i)$ and $P(S_i)$, exactly compute $p(S_i) \cdot A_i$.
2. Determine the shift $X_i$ to determine $p(S_i) \cdot A_i \cdot 2^{X_i} \Sigma \mathcal{R}$.
3. Find the lower approximation on #A bits closest to $p(S_i) \cdot A_i \cdot 2^{X_i}$, which gives $A_{i+1}$.
4. Exactly compute $R_i = P(S_i) \cdot A_i$.
5. Exactly compute $\zeta_i = C_i + R_i$.
6. Emit the carry-out and $X_i$ most significant bits of $\zeta_i$, which forms the variable width block $B_i$.

It should be noted that the definitions of the quantities in the algorithm determine certain length relations:

by cumulative probability definition #P=#p.

by stages 1 and 2, $X_{max}$=#p.

by stage 4, #R=#P+#A=#p+#A.

by stage 6, #B=1+$X_{max}$=1+#p (the width of $B_i$ is variable, but a large number of bits is required for representing the longest possible value of $B_i$), by stage 7, #C=#R=#p+#A.

Thus, the parameters #p and #A determine the length of all the other quantities in these equations.

Thus an explanation has been given as to how the sequence of variable width blocks $B_i$ is produced by the algorithm. Each block contains 1+$X_i$ bits, consisting of the carry-out and $X_i$ most significant bits of the sum $\zeta = C_i + R_i$. These variable length blocks can be assembled in a sequence of fixed length blocks $T_k$. The sequence of blocks $T_k$ constitutes the output coding flow. The assembly process is performed by a standard method, which does not concern us in the remainder of the present document.

It is possible to summarize stages 1 to 7 of the finite precision algorithm given above by the following equations:

$$(A_{i+1}, X_i, R_i) = f(S_i, A_i) \quad (3)$$

$$(C_{i+1}, B_i) = f(C_i, R_i, X_i) \quad (4)$$

The function $f$ effects stages 1 to 4 and the function stages 5 to 7 given above.

Interval Width Update Prior Art

Interval width updating consists of the following stages:
1. Obtain $p(S_i)$ and $P(S_i)$, exactly compute $p(S_i) \cdot A_i$.
2. Determine the shift $X_i$ to represent $p(S_i) \cdot A_i \cdot 2^{X_i} \Sigma_{\mathcal{R}}$.
3. Find the lower approximation on #A bits closest to $p(S_i) \cdot A_i \cdot 2^{X_i}$, which gives $A_{i+1}$.
4. Exactly compute $R_i = P(S_i) \cdot A_i$.

This interval width updating technique also suffers from a disadvantage in that this algorithm requires two multiplications for each coded symbol, which is an obstacle to high speed implementation.

For this reason various authors have proposed coder versions having no multiplication. These versions can be subdivided into two categories. Those of the first category require that the binary representation of always has a particular form. They take advantage of this by replacing the multiplications by other, simpler operations. Those of the second category make use of the table lookup principle. These methods will now be described.

We will start with the first category and refer to articles by Jorma Rissanen and IK. M. Mohiuddin entitled "A Multiplication Free Multialphabet Arithmetic Code" (IEEE Transactions on Communications, 37(2), pp. 93–98, 1989) and Dan Chevion, Ehud Karnin and Eugene Walach entitled "High Efficiency, Multiplication Free Approximation of Arithmetic Coding" (Proceedings of the IEEE Data Compression). In the two other methods, they introduce a new complication on suppressing multiplications.

Moreover, in each of these methods, the possible values of $A_i$ are not uniformly distributed in their admissible range $\mathcal{R}$. This leads to an inefficiency in coding. By increasing #A for these methods there is only a slight, even no efficiency improvement, because the new values which can be assumed by $A_i$ are grouped around ½ in the case of Chevion, Karnin and Walach, or around 1 in the case of Tong and Blake. It is not possible to increase #A in the case of Rissanen and Mohiuddin.

The approach of the second category of solutions for this problem consists of updating the state of the coder by a table lookup.

It is pointed out that the state of the coder, as described by equations (3) and (4), is determined by the bits of quantities $A_i$ and $C_i$. These equations express how it is possible to update this state by coding the symbol $S_i$ and producing the block $B_i$. Let us write $Z_i$ for the bits representing the current state of the coder (i.e. the bits of $A_i$ and $C_i$) and $Z_{i+1}$ for the next value. It is possible to mix the two equations (3) and (4) to obtain $$(B_i, X_i, Z_{i+1}) = h(S_i, Z_i) \quad (5)$$

where the function h represents all the aforementioned stages 1 to 7.

Thus, the authors Paul G. Howard and Jeffrey Scott Vitter, in their article entitled "Practical Implementations of Arithmetic Coding" (in the book image and Text Compression, Kluwer Academic Publishers, Boston, 1992, pp. 85–112), proposed the implementation of an arithmetic coder, where such a function h is represented by a table. In order to code a symbol $S_i$, the symbol and the state of the coder $Z_i$ is taken, table lookup takes place and the block $B_i$ is found there, together with its width $X_i$ and the new state of the coder $Z_{i+1}$.

However, this method suffers from a significant defect, the width of such a table in bits being $$(\#B + \#X + \#Z) \cdot 2^{\#+\#Z}$$

This number increases at superexponential speed to #Z. Thus, with the exception of the case where #Z is small, this method is unusable. Moreover, it would be desirable to have a relatively high value of #Z for the reasons given below.

It should firstly be noted that the number of input bits for the equation (5) is #s+#Z=#s+2#A+#p. It is now pointed out that each quantity $p(s^k)$ or $P(s^k)$ is a real number between 0 and 1, which can be represented on #p bits. In order to compress the input flow, the distribution of probabilities must be non-uniform. In addition, this non-uniformity must be reflected in the probability values used for the computation. Obviously, there is no control of the input flow content. However, if there is a favorable distribution, in order to be able to exploit it, it must be possible to represent the numbers which are just below 1, as well as those which are just above 0. Thus, it is desirable to have #p as high as possible, so as to be able to represent the widest possible probability range.

Howard and Vitter recognize this problem and introduce other ideas for solving it. However, their solution uses a binary alphabet, which only has two symbols. Our invention deals with the case of a multialphabet.

Description Of The Invention

The present invention relates to an interval width update process in arithmetic coding, characterized in that selection takes place of a set of values $$\mathcal{A} = \{A[0], A[1], \ldots, A[r-1]\},$$

and the interval width is maintained as an index $W_i$ in said set. These values can be represented with any random precision.

In order to construct an arithmetic coder using the index $W_i$ as well as the value $A_i$, equation (3) is replaced by the equation:

$$(W_{i+1}, X_i, R_i) = f''(S_i, W_i).$$

The function $f''$ is stored in a table. A single table lookup replaces all these operations: $p(S_i)$ and $P(S_i)$ are determined from $S_i$, $A[W_i]$ is determined from $W_i$, $p(S_i) \cdot A[W_i]$ and $R_i = P(S_i) \cdot A[W_i]$ are computed, the shift $X_i$ necessary for representing $p(S_i) \cdot A[W_i] \cdot 2^{X_i}$ in $\mathcal{R}$ is determined, $W_{i+1}$ is determined in such a way that $A[W_{i+1}]$ is best representative of $p(S_i) \cdot A[W_i] \cdot 2^{X_i}$, followed by return to $W_{i+1}$, $X_i$ and $R_i$.

In a first variant the table is computed beforehand.

In a second variant the table is dynamically computed.

As only the interval width update is processed by the table lookup method, the aforementioned problem of Howard and Vitter is avoided. The number of input bits of function $f''$ is only #s+#W, a quantity which is independent of #p.

As it is possible to choose the values of the set $\mathcal{A}$, it is possible to uniformly distribute them in the rank $\mathcal{R}$ and therefore avoid the compression loss caused by the methods of Rissanen and Mohiuddin, Chevion, Karnin and Walach, and Tong and Blake.

As the quantity Wi of width #W bits, as well as Ai of width #A bits is processed, it is possible to obtain a smaller table than an implementation by table of the function $f$ of equation (3).

The invention makes it possible to improve the efficiency of coding of non-adaptive arrangements for high speed arithmetic coding by improving the efficiency in the updated interval width.

The present invention permits both a higher speed and a more effective data compression by the well known arithmetic coding technique. It can constitute the basis for a hardware or software product intended for data compression purposes. This product can e.g. be used for the compression of data to be transmitted on a communications channel, or for storage in a system of files.

A naive algorithm for arithmetic coding requires two multiplications for each coded symbol. The invention eliminates both the multiplications and achieves a compression efficiency superior to the aforementioned methods without any multiplications.

DETAILED DESCRIPTION OF THE EMBODIMENTS

General Structure Of An Arithmetic Coding System

Figure 1:
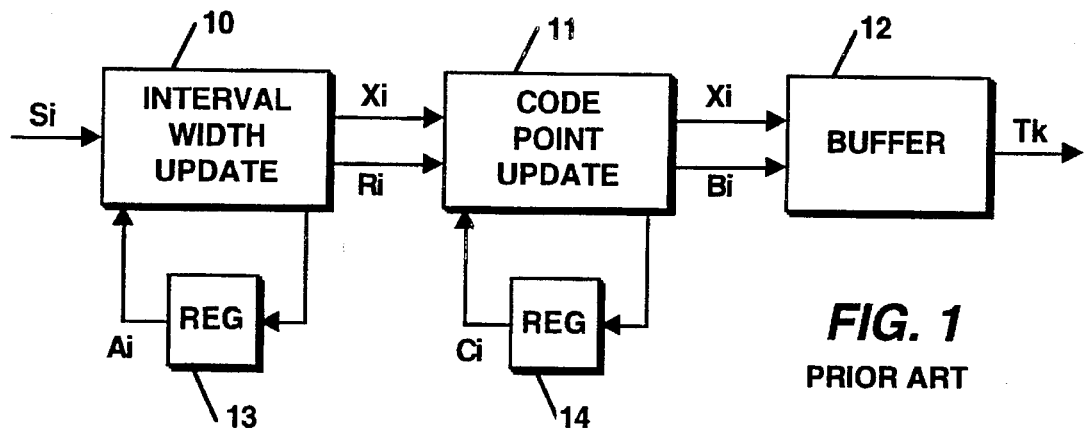
FIG. 1 shows the architecture of a prior art arithmetic coder.

FIG. 1 shows the architecture of a prior art coder, whose object is to code the symbol Si. It comprises an interval width update unit 10, a code point update unit 11 and optionally a buffer circuit 12.

The interval width update unit 10 supplies two signals Xi and Ri to the code point update unit 11. An output of the unit 10 connected to a register 13 makes it possible to supply the signal Ai to an input of said module. An output of the unit 11 connected to a register 14 makes it possible to supply a signal Ci to another input of the module 11. On its two inputs the buffer circuit 13 receives the signals from the code point update unit 11, namely Xi and Bi, in order to deliver a signal Tk.

The interval size update unit 10 makes it possible to update Ai in the register 13. For each stage of the algorithm it takes a new symbol Si and the current value of the register 13. It generates the augend Ri, the shift Xi and the new value Ai+1 for the register. Thus, it updates the current interval width Ai. In the same way the code point update unit 11 makes it possible to update Ci in register 14. For each stage it takes into account the shift Xi, the augend Ri and the current value of the register 14 by producing a new value for Ri and a variable length block Bi of width 1+Xi. The value Xi is not modified.

The variable block buffer circuit 12 assembles the sequence of variable length blocks into fixed length blocks Tk, which constitute the output of the coder.

Function Of The Interval Width Update Unit

Figure 2:
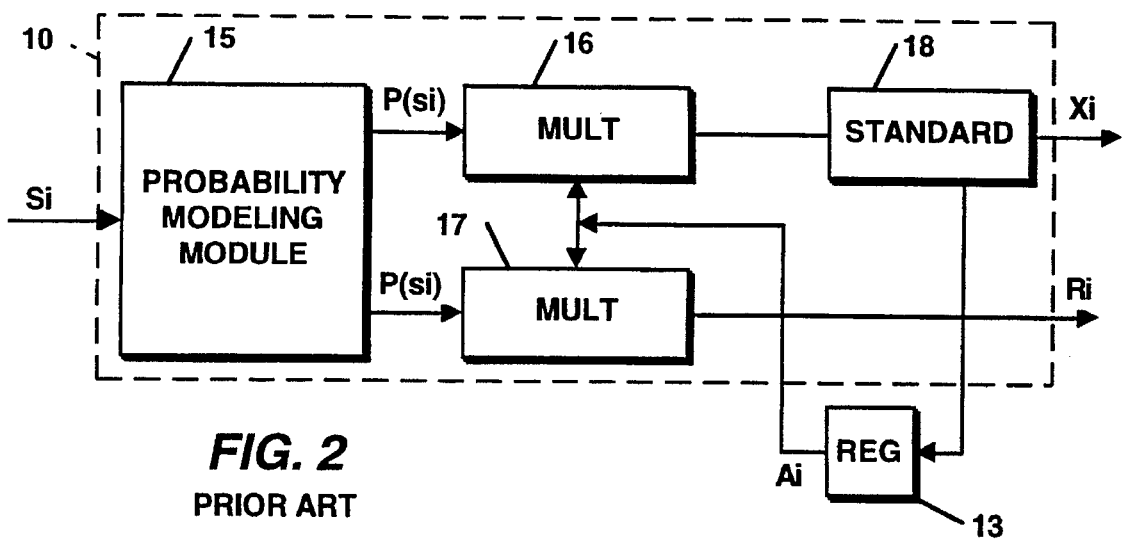
FIG. 2 shows a prior art interval width update unit.

The prior art interval width update unit 10 shown in FIG. 2 comprises a probability modelling module 15, whose two outputs, supplying the signals p(Si) and P(Si) are respectively connected to a first multiplier 16 followed by a standardization module 18 for supplying the signal Xi and to a second multiplier 17 supplying the signal Ri. An output of the standardization module 18 is connected to an input of each multiplier 16 and 17 across the register 13.

This unit performs the following stages:

1. Obtain p(Si) and P(Si), exactly compute p(Si)·Ai.
2. Determine the shift Xi to represent $p(Si) \cdot Ai \cdot 2^{Xi} \Sigma_R$.
3. Find the lower approximation on #A bits closest to $p(Si) \cdot Ai \cdot 2^{Xi}$, which gives Ai+1.
4. Exactly compute Ri=P(Si)·Ai.

In the interval width update unit 10 according to FIG. 2 during each operating cycle a new value can be generated in the register 13. In this unit there is a loop emanating from the register across the first multiplier 16 and the standardization unit 18 and which returns to the register 14. The presence of this loop imposes a fundamental limit to the circuit operating speed.

On considering said loop, if ti is the instant at which Ai is stored in the register 14 and ti+1 the instant at which Ai+1 is stored in the register 14, the difference ti+1−ti cannot be reduced below the time necessary for the electric signal to propagate through the first multiplier 16 and the standardization unit 18.

Thus, it is possible to terminate the computation by storing an incorrect value for Ai+1 if the output of the restandardization unit is not then stabilized. Thus, the operating speed of this unit is limited by the size of the considered operands and in this loop the speed is dependent on #p and #A.

Thus, in order to compress data it is necessary to represent values p(Si) and P(Si) very close to 0 or 1, so that the value #p must be high. However, in order that the circuit can operate rapidly #p must be low.

Therefore a compromise must be made between a rapid circuit which performs an effective compression and an effective circuit which operates slowly.

Description Of The Fundamental Principle Of The Invention

The proposal is to replace this unit with a single reference to the memory of the system. As stated hereinbefore, the article of Howard and Vitter proposes roughly the same idea, but for the updating of any state of the coder. We also propose a consultation or lookup of a table stored in the memory, but only for the updating of the interval width and using a non-arithmetic representation for the interval width. The notion of non-arithmetic representation is a key idea of the invention which will now be explained.

In the process according to the invention selection takes place of a set of r values $\mathcal{A}=\{A[0], A[1], \ldots, A[r-1]\}$ and the interval width is maintained as an index Wi in said set. This method is referred to as a non-arithmetic representation of the interval width. This makes it possible to uniformly distribute the values within the admissible range and therefore obtain a higher compression level.

This process might give the appearance of reducing the coding speed, in view of the fact that the multiplications and realignment must now be preceded by a table lookup (for converting the index Wi into an arithmetic value Ai) and followed by a search (for reconverting the approximate value product into an updated index Wi+1). However, it has been found that the width updating stage can be performed by a single table lookup, which brings about both an interval width updating and supplies the shift augend. In terms of symbols, this operation can be written:

(Wi+1, Xi, Ri)=f"(Si, Wi)

in which $f''$ indicates the reference to the table stored in the memory.

Thus, a single table lookup of $f''$ replaces all these operations: p(Si) and P(Si) are determined from Si, A[Wi] is determined from Wi, p(Si)·A[Wi] and Ri=P(Si)·A[Wi] are computed, the shift Xi necessary for representing p(Si)·A[Wi]·$2^{Xi}$ in $\mathcal{R}$ is determined, Wi+1 is determined in such a way that A[Wi+1] is the best representative of p(Si)·A[Wi]·$2^{Xi}$, followed by return to Wi+1, Xi and Ri. An essential characteristic of the invention consequently consists of adding an indirection level, which eliminates the limitations imposed by a random particular arrangement for the representation of numbers. Normally this would impose a certain supplementary processing cost for each cycle, firstly for dereferencing the index and then for expressing the calculated result in index form. However, in the process according to the invention the cost is compensated by autonomous table creation.

The table can be computed beforehand or dynamically. If it is envisageable to used fixed probabilities, it is possible to compute the table beforehand, using the stages referred to hereinbefore and this is referred to as non-adaptive compression.

However, if it is wished to have a system which can adapt to changes of sequences of symbols, it can be carried out by:

performing a subsampling of a sequence of symbols Si, using them for estimating the change of probabilities, recreating the table by using the above stages, but with new probabilities, storing the new table in another RAM sector, consulting the new table.

This non-arithmetic representation of the interval width permits a particularly reduced representation of the necessary table. The table address is constituted in the form of a concatenation of the current symbol Si and the interval width index width Wi. The number of bits used for representing Wi is still equal to or below the number of bits used for representing Ai.

As the quantity #W can be below #A, it is possible to bring about a significant reduction in the size of the table. Although equations (3) and (6) have identical forms, the second only requires (#W+#X+#R)·$2^{\#W}$ bits, whereas the first requires (#A+#X+#R)·$2^{\#A}$.

Finally, in view of the fact that it is possible to freely choose a random set of representatives, the efficiency of this method is generally equal to or superior to that corresponding to the aforementioned references, because it is possible to use as representatives the admissible values Ai of one or other of the arrangements.

Characteristics Of Performing The Invention

In an embodiment the coder according to the invention is used on a reconfigurable coprocessor. The latter is constituted by an array of programmable flip-flops and four static RAM banks together with a 32 bit wide FIFO serving as the interface for a central computer.

Bearing in mind the structure of this coprocessor, #C=16 is chosen. $P_{min}$ represents the smallest representable probability. If it is wished to code a set of ASCII symbols (with 256 characters), it is necessary to take #p≧8. Any lower value would lead to $p_{min} \geq 1/128$, which would make at least half the symbols uncodable. However, by taking #p=8, this leads to p($s^k$)=1/256 for each symbol, which supplies no compression. #p=12 is set.

In view of the fact that each product P(Si)·Ai must be represented according to #C bits in such a way that #A+#p≦#C, this means that #A≦4. #A=4 is chosen for the elements of $\mathcal{A}$, but then #W=3 is set. As #p=12, we have $p_{min}=2^{-12}$. Thus, $X_{max}=12$, which leads to #X=4.

Figure 3:
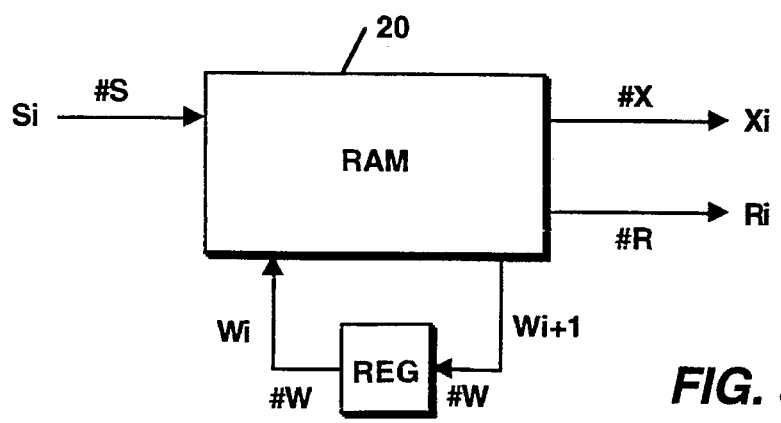
FIG. 3 shows an interval width update unit according to the invention.

Into a width updating is performed as an access to a RAM 20 shown in FIG. 3. A 12 bit address is formed by concatenation of the current symbol Si at 9 bits (8 bits for selecting the ASCII character and a single EOF bit used as an end of file mark) and the three bits of index Wi.

In this embodiment, a new symbol is coded on both clock pulses (this is performed in order to multiplex certain values on the buses with 16 available bits and for giving two clock pulses for memory access). At ambient temperature, the arrangement according to the invention operates in error-free manner at 29.2 ns. Thus, a new symbol is coded every 58.4 ns, which gives a compression speed of 16.3 MByte/s.

We claim:

1. Interval width update process in arithmetic coding, characterized in that a set of values $\mathcal{A}$={A[0], A[1], . . . , A[r−1]}, is selected and the interval width is maintained as an index Wi in said set, a table lookup simultaneously updates the interval width and supplies the augend and shift by performing the following operation:

(Wi+1, Xi, Ri)=f"(Si, Wi)

in which the function $f''$ is implemented by a table lookup, in which p(Si) and P(Si) are determined from Si, A[Wi] is determined from Wi, p(Si)·A[Wi] and Ri=P(Si)·A[Wi] are computed, the shift Xi necessary for representing p(Si)·A[Wi]·$2^{Xi}$ in $\mathcal{R}$ is determined. Wi+1 is determined in such a way that A[Wi+1] is the best representative of p(Si)·A[Wi]·$2^{Xi}$, followed by return to Wi+1, Xi and Ri, wherein A is interval width Xi is a shift Ri is augend of P(Si)·Ai p(Si) is symbol occurrence probability P(Si) is cumulative symbol probability R is range of admissible values of Ai Si=symbol to be coded in stage i.

2. Process according to claim 1, characterized in that the table is calculated beforehand.

3. Process according to claim 1, characterized in that the table is calculated dynamically.

* * * * *